United States Patent [19]
Kim et al.

[11] Patent Number: 5,922,405
[45] Date of Patent: Jul. 13, 1999

[54] PROCESS FOR THE PREPARATION OF ALUMINUM OXIDE FILM USING DIALKYLALUMINUM ALKOXIDE

[75] Inventors: Yun-Soo Kim; Won-Yong Koh, both of Daejeon; Su-Jin Ku, Taegu, all of Rep. of Korea

[73] Assignee: Korea Research Institute of Chemical Technology, Daejeon, Rep. of Korea

[21] Appl. No.: 09/077,450

[22] PCT Filed: Dec. 3, 1996

[86] PCT No.: PCT/KR96/00230

§ 371 Date: May 29, 1998

§ 102(e) Date: May 29, 1998

[87] PCT Pub. No.: WO97/20963

PCT Pub. Date: Jun. 12, 1997

[30] Foreign Application Priority Data

Dec. 4, 1995 [KR] Rep. of Korea ................. 95-46455

[51] Int. Cl.$^6$ .................................................. C23C 16/40

[52] U.S. Cl. .................. 427/248.1; 427/255; 427/314; 427/126.3

[58] Field of Search .................... 427/248.1, 255, 427/314, 126.3

[56] References Cited

U.S. PATENT DOCUMENTS 5,389,401  2/1995  Gordon .
5,496,597  3/1996  Soininen et al. ................. 427/584

FOREIGN PATENT DOCUMENTS

0460254A1  12/1991  European Pat. Off. .

*Primary Examiner*—Roy V. King
*Attorney, Agent, or Firm*—Anderson, Kill & Olick, P.C.

[57] ABSTRACT

An aluminum oxide film is economically and conveniently deposited on a substrate by a process which comprises vaporizing a dialkylaluminum alkoxide compound at a temperature ranging from 0 to 25° C. and contacting the resulting vapor with said substrate heated to a temperature ranging from 300 to 600° C.

6 Claims, 2 Drawing Sheets

PROCESS FOR THE PREPARATION OF ALUMINUM OXIDE FILM USING DIALKYLALUMINUM ALKOXIDE

FIELD OF THE INVENTION

The present invention relates to a process for coating a substrate with an aluminum oxide film by chemical vapor deposition using a dialkylaluminum alkoxide compound as an aluminum source.

BACKGROUND OF THE INVENTION

There have hitherto been reported a number of chemical vapor deposition (CVD) methods for the preparation of an aluminum oxide film. These methods are well summarized in recent review by E. Fredriksson et al., "Chemical Vapour Deposition of Aluminum Oxides from Various Gas Mixture," and *J. Chemical Vapor Deposition*, 1, 333–417 (1993) as well as in Korean translation of "CVD Handbook" pp 665–689 (Bando Publishing Co., Seoul, Korea, 1993). Aluminum trichloride and triisopropoxide have been most commonly used as aluminum sources in the CVD of an aluminum oxide film due to their low cost and ready availability. These conventional aluminum sources have low vapor pressures and are usually heated to higher than 100° C. to generate a vapor stream to be used in a CVD process.

Further, trialkylaluminums have been used in the CVD of an aluminum oxide film, which are liquid at room temperature and have relatively high vapor pressure. However, such trialkylaluminums do not contain oxygen atoms, thus the use of an oxygen source such as $O_2$ or $N_2O$ is essential for the formation of an aluminum oxide film. Also trialkylaluminums are pyrophoric when exposed to air. U.S. Pat. No. 4,675,089 discloses a plasma-assisted CVD method of depositing an amorphous thin film of aluminum oxide using a trialkylaluminum vapor and carbon dioxide. However, this method requires expensive equipments to produce plasma and have lower throughput compared to a thermal CVD method, thus less suitable for use in a large-scale application.

SUMMARY OF THE INVENTION

Accordingly, it is an object of the present invention to provide an efficient and economical process for the preparation of an aluminum oxide film suitable for a large-scale production of articles coated with aluminum oxide film.

In accordance with one aspect of the present invention, there is provided a process for coating a substrate with an aluminum oxide film, which comprises contacting a vaporized dialkylaluminum alkoxide compound with said substrate heated to a temperature ranging from 300 to 600° C.

DETAILED DESCRIPTION OF THE INVENTION

Figure 1:
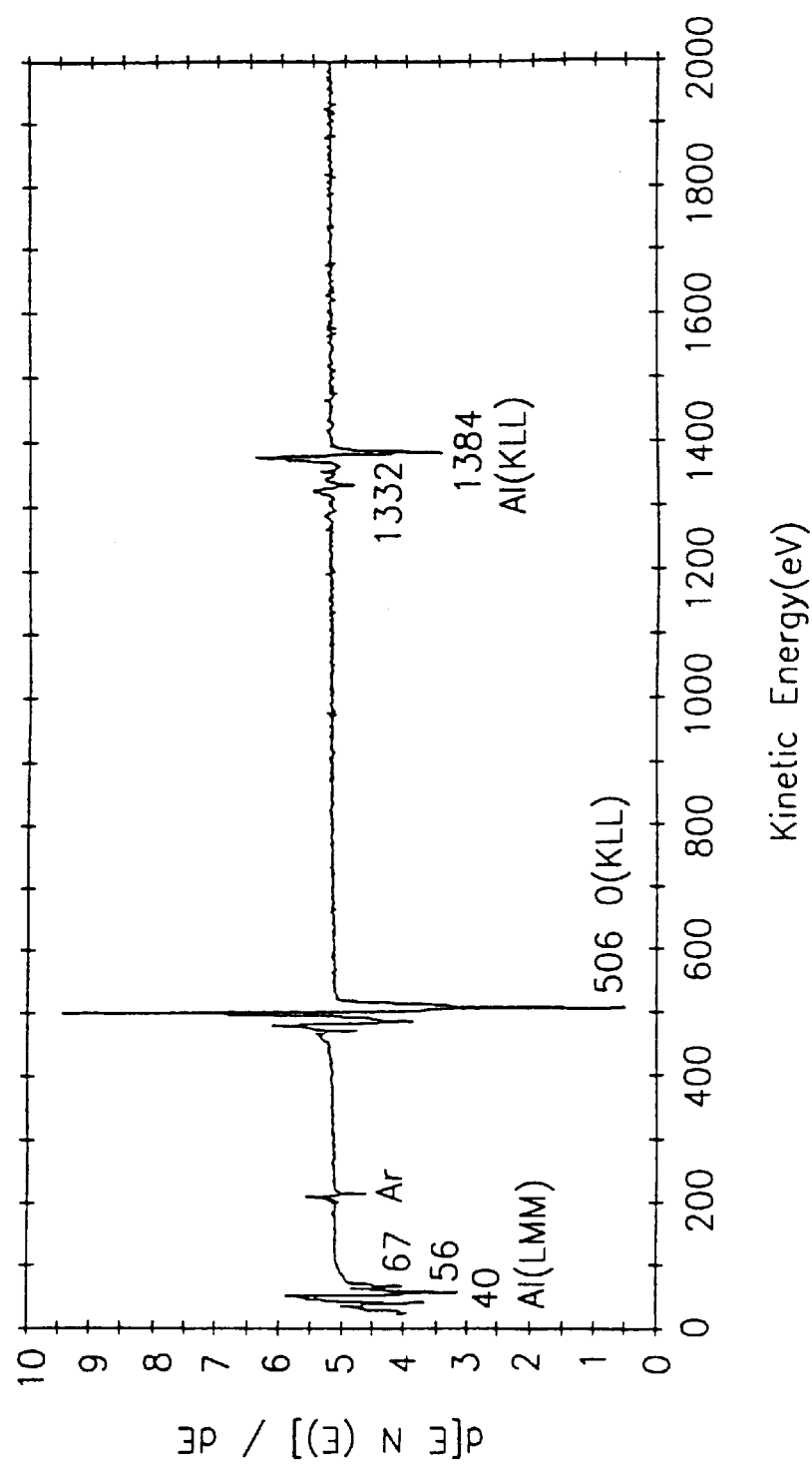
FIG. 1 represents an Auger electron spectrum of an aluminum oxide film deposited on SI(100) at 400° C. using diethylaluminum isopropoxide in accordance with Example 6 of the present invention.

The present invention is characterized in that a dialkylaluminum alkoxide is used as an aluminum source in the chemical deposition of an aluminum oxide film.

The dialkylaluminum alkoxide useful for practicing the present invention is a material which has a high vapor pressure sufficient to vaporize under an ambient condition, i.e., 0.06 to 0.5 mmHg at a temperature ranging from 0 to 25° C. The dialkylaluminum alkoxide compound suitable for use in the present invention is represented by the following formula:

$R^1_2AlOR^2$

wherein $R^1$ and $R^2$ are each independently a $C_{1-10}$ alkyl group.

The dialkylaluminum alkoxide compound according to the present invention may be prepared by reacting an alkylaluminum with an alcohol at a low temperature by a conventional method, e.g., as is described by Paul S. Coan, et al. in *Organometallics*, 8, 2724 (1989), or by reacting an alkylaluminum with an aluminum alkoxide in a molar ratio of 2:1 at room temperature.

The preferred dialkylaluminum alkoxide compound in practicing the present invention may be dimethylaluminum isopropoxide, diethylaluminumisopropoxide, dimethylaluminum t-butoxide and a mixture thereof. Under an ambient condition, dimethylaluminum isopropoxide is a liquid, whereas diethylaluminum isopropoxide and dimethylaluminum t-butoxide are gel-like solids.

In accordance with the present invention, the dialkylaluminum alkoxide compound is vaporized at an ambient temperature ranging from 0 to 20° C. and the vapor thereof is then contacted with the surface of a substrate heated at a temperature ranging from 300 to 600° C. to deposit an aluminum oxide film thereon.

The vaporization of dialkylaluminum alkoxide compound may be carried out in a reactor which is preferably maintained at an internal pressure of 10 to 50 mbar.

The substrate which may be used in practicing the present invention is an inorganic solid which is stable under the CVD condition and examples thereof include glass, quartz, silicon, gallium arsenide, sapphire, alkali metal niobate, alkaline earth metal titanate, gallium nitride, niobium nitride and the like, among which silicon single crystal is preferred when the coated substrate is intended for electronic applications.

The following Preparatives and Examples are provided for the purposes of illustrating certain aspects of the present invention only; they are not to be construed as limiting the scope of the present invention in any way.

Preparative 1: Synthesis of dimethylaluminum t-butoxide

To 2.07 g (28.7 mmol) of trimethyl aluminum dissolved in 30 ml of dry ethyl ether was added 2.13 g (28.7 mmol) of t-butanol at −70° C., and the resulting mixture was warmed to room temperature while stirring and the solvent was evaporated off under a reduced pressure. The residue was sublimed to obtain 2.16 g (16.6 mmol, 58% yield) of the title compound in the form of a gel-like solid. $^1$H NMR analysis in benzene-$d_6$ of the compound obtained showed peaks at δ−0.42(s, Al(CH$_3$)$_2$, 6H) and 1.15(s, OC(CH$_3$)$_3$, 9H).

Preparative 2: Synthsis of dimethylaluminum isopropoxide

To 2.75 g (38.1 mmol) of trimethyl aluminum was added 3.90 g (19.1 mmol) of aluminum isopropoxide which was previously purified by distillation under a reduced pressure to obtain 12.52 g (108 mmol, 87% yield) of the title compound in the form of a colorless liquid that boils at a temperature ranging from 68 to 72° C. at 10 mmHg. $^1$H NMR in benzene-$d_6$ analysis of the compound obtained showed peaks at δ−0.47(s, Al(CH$_3$)$_2$, 6H), 0.99(d, OCH(CH$_3$)$_2$, 6H) and 3.84(heptet, OCH(CH$_3$)$_2$, 1H).

Preparative 3: Synthsis of diethylaluminum isopropoxide

To 1.21 g (10.6 mmol) of triethyl aluminum (93% purity, Aldrich Chemical Co.) was added 1.08 g (5.3 mmol) of aluminum triisopropoxide which was previously purified by distillation under a reduced pressure, and the resulting mixture was stirred for 24 hours and the mixture was sublimed to obtain 1.89 g (13.5 mmol, 85 yield as diethylaluminum isopropamide) of the title compound in the form of a gel-like solid.

EXAMPLE 1

0.05 g of dimethylaluminum t-butoxide prepared in Preparative 1 was vaporized at 0° C. and the vapor thereof was conveyed to a Si(100) substrate preheated to 400° C. to conduct the chemical vapor deposition for 3 hours. The X-ray photoelectron spectrum of the deposited film showed peaks corresponding to oxygen and aluminum as well as carbon, but not the peaks for silicon. This observation shows that the surface of the silicon substrate is completely covered by an aluminum oxide film.

EXAMPLE 2

The procedure of Example 1 was repeated except that the Si(100) substrate was preheated to 300° C. and the chemical vapor deposition was carried out for 1 hour. The X-ray photoelectron spectrum of the deposited film showed peaks corresponding to oxygen and aluminum as well as carbon, but not the peaks for silicon.

EXAMPLE 3

0.1 g of dimethylaluminum isopropoxide prepared in Preparative 2 was vaporized at room temperature and the vapor thereof was transported to a Si(100) substrate preheated to 350° C. to conduct the chemical vapor deposition for 5 hours. The X-ray photoelectron spectrum of the deposited film showed peaks corresponding to oxygen and aluminum as well as carbon, but not the peaks for silicon.

EXAMPLE 4

0.1 g of diethylaluminum isopropoxide prepared in Preparative 3 was vaporized at room temperature and the vapor thereof was brought into contact with a Si(100) substrate preheated to 350° C. to conduct the chemical vapor deposition for 2 hours. The X-ray photoelectron spectrum of the deposited film showed peaks corresponding to oxygen and aluminum as well as carbon, but not the peaks for silicon.

EXAMPLE 5

0.1 g of dimethylaluminum isopropoxide prepared in Preparative 2 was vaporized at room temperature and the vapor thereof was carried to a Si(100) substrate preheated to 600° C. to conduct the chemical vapor deposition for 5 hours. The X-ray photoelectron spectrum of the deposited film showed peaks corresponding to oxygen and aluminum as well as carbon, but not the peaks for silicon.

EXAMPLE 6

Figure 2:
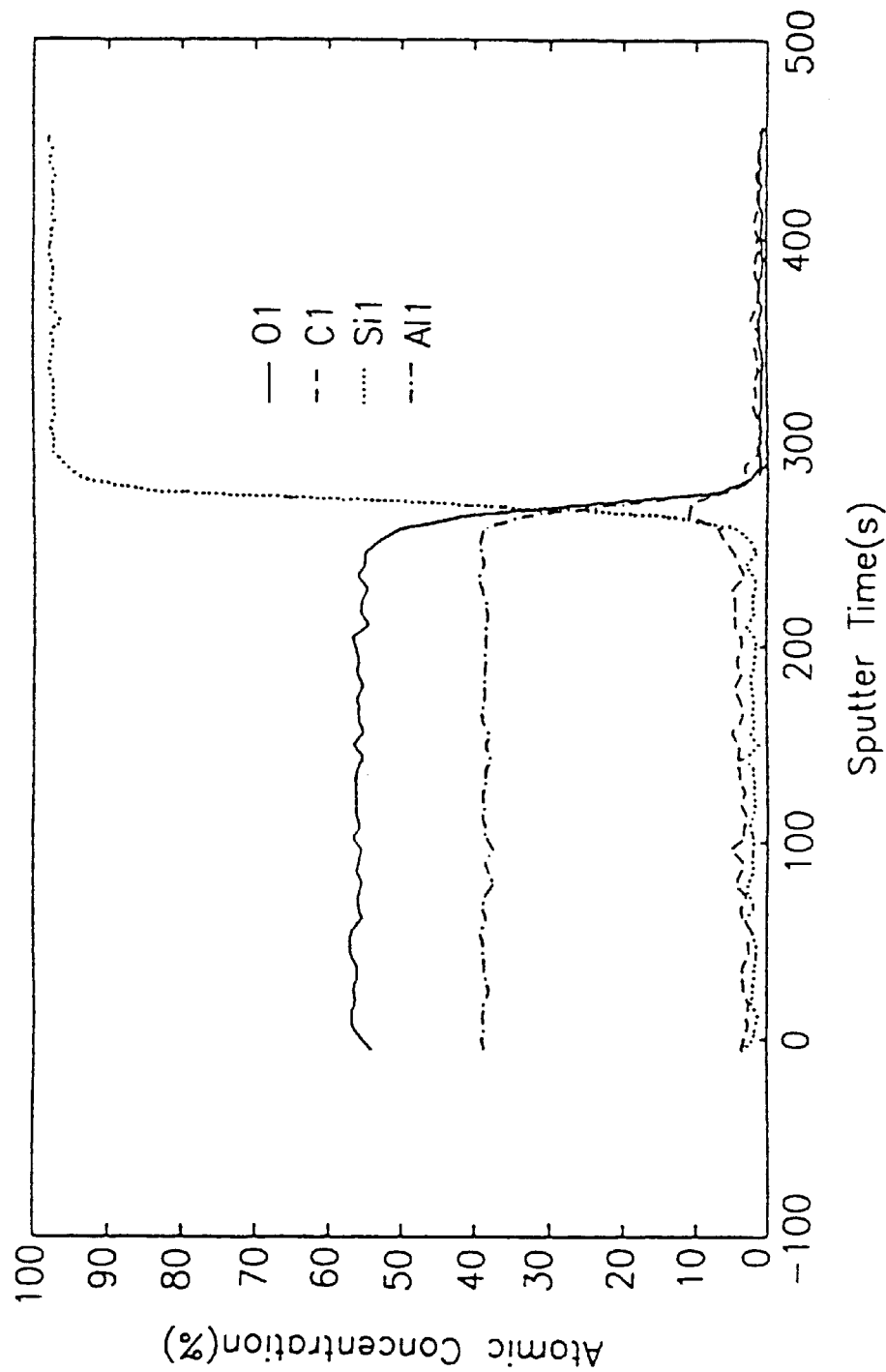
FIG. 2 shows an Auger depth profile of the film obtained in Example 6.

0.1 g of diethylaluminum isopropoxide prepared in Preparative 3 was vaporized at room temperature and the vapor thereof was transported to a Si(100) substrate preheated to 400° C. to conduct the chemical vapor deposition for 10 hours. The Auger electron spectrum of the deposited film obtained after sputtering for 6 seconds with 3.5 keV Ar$^+$ion beam is shown in FIG. 1. And Auger depth profile of the same film is shown in FIG. 2.

These data clearly indicate that the film is stoichimetric with no appreciable carbon incorporation and the composition is constant through the bulk of the film.

The thickness of the aluminum oxide film is estimated at 0.23 $\mu$m, assuming an etch rate of 0.83 nm/s.

In accordance with the present invention as described above, an aluminum oxide film can be conveniently and effectively deposited on a substrate by way of using a dialkylaluminum alkoxide compound as an aluminum source. The inventive process has the advantage that gas phase mixing can be completely avoided because no additional oxygen source is necessary, thus a large-scale production of aluminum oxide films is possible using simple equipments under much simplified conditions.

While the invention has been described with respect to the specific embodiments, it should be recognized that various modifications and changes may be made by those skilled in the art to the invention which also fall within the scope of the invention as defined by the appended claims.

What is claimed is:

1. A process for coating a substrate with an aluminum oxide film, which comprises contacting a vaporized dialkylaluminum alkoxide compound of formula (I) with said substrate:

$$R^1{}_2AlOR^2 \tag{I}$$

wherein $R^1$ and $R^2$ are each independently a $C_{1-10}$ alkyl group.

2. The process of claim 1 wherein the substrate is heated to a temperature ranging from 300 to 600° C.

3. The process of claim 1 wherein the vaporization of dialkylaluminum alkoxide compound is conducted at a temperature ranging from 0 to 25° C.

4. The process of claim 2 wherein the dialkylaluminum alkoxide compound is selected from the group consisting of dimethylaluminum isopropoxide, diethylaluminum isopropoxide, dimethylaluminum t-butoxide and a mixture thereof.

5. The process of claim 4 wherein the dialkylaluminum alkoxide compound is dimethylaluminum isopropoxide.

6. The process of claim 1 wherein the substrate is a silicon single crystal.

* * * * *